(12) United States Patent
Chang et al.

(10) Patent No.: US 10,062,613 B1
(45) Date of Patent: Aug. 28, 2018

(54) SEMICONDUCTOR DEVICE AND METHOD FOR FABRICATING THE SAME

(71) Applicants: UNITED MICROELECTRONICS CORP., Hsin-Chu (TW); Fujian Jinhua Integrated Circuit Co., Ltd., Quanzhou, Fujian Province (CN)

(72) Inventors: Feng-Yi Chang, Tainan (TW); Shih-Fang Tzou, Tainan (TW); Yu-Cheng Tung, Kaohsiung (TW); Ming-Feng Kuo, Tainan (TW); Li-Chiang Chen, Tainan (TW)

(73) Assignees: UNITED MICROELECTRONICS CORP., Hsin-Chu (TW); Fujian Jinhua Integrated Circuit Co., Ltd., Quanzhou, Fujian Province (CN)

( * ) Notice: Subject to any disclaimer, the term of this patent is extended or adjusted under 35 U.S.C. 154(b) by 0 days.

(21) Appl. No.: 15/611,759

(22) Filed: Jun. 1, 2017

(30) Foreign Application Priority Data

May 4, 2017 (CN) .......................... 2017 1 0308679

(51) Int. Cl.
*H01L 27/108* (2006.01)
*H01L 29/51* (2006.01)
*H01L 29/78* (2006.01)
*H01L 21/8234* (2006.01)

(52) U.S. Cl.
CPC ............... *H01L 21/823456* (2013.01); *H01L 21/82345* (2013.01); *H01L 21/823481* (2013.01); *H01L 27/10823* (2013.01); *H01L 27/10876* (2013.01)

(58) Field of Classification Search
CPC ....... H01L 21/28026; H01L 21/823842; H01L 29/66545; H01L 29/4236; H01L 21/82345; H01L 29/401; H01L 29/4958; H01L 29/51; H01L 21/823; H01L 21/2856; H01L 29/495; H01L 29/7837; H01L 29/41791; H01L 29/66666; H01L 27/092
See application file for complete search history.

(56) References Cited

U.S. PATENT DOCUMENTS

| 9,070,744 | B2 | 6/2015 | Yan | |
| 9,972,623 | B1* | 5/2018 | Lin | ........................ H01L 27/092 |
| 2014/0004693 | A1* | 1/2014 | Hoon | ................. H01L 21/28079 438/589 |
| 2014/0197484 | A1* | 7/2014 | Anathan | ........... H01L 29/42376 257/330 |
| 2015/0194438 | A1 | 7/2015 | Kim et al. | |

(Continued)

OTHER PUBLICATIONS

Lee, Title: DRAM Life Extension Challenge and Response; 2015 IEDM Short Course, Dec. 6, 2015.

(Continued)

*Primary Examiner* — Caridad Everhart
(74) *Attorney, Agent, or Firm* — Winston Hsu

(57) ABSTRACT

A method for fabricating semiconductor device includes the steps of: forming a first trench and a second trench in a substrate; forming a first work function metal layer in the first trench and the second trench; forming a patterned mask to cover the second trench; removing the first work function metal layer from the first trench; forming a second work function metal layer in the first trench and the second trench; and forming a conductive layer in the first trench and the second trench to form a first gate structure and a second gate structure.

10 Claims, 6 Drawing Sheets

(56) References Cited

U.S. PATENT DOCUMENTS

2016/0056160 A1* 2/2016 Jang .................. H01L 27/10823
                                                           257/331
2017/0186746 A1* 6/2017 Chung ................ H01L 27/0922
2017/0317210 A1* 11/2017 Anderson ........... H01L 29/7827

OTHER PUBLICATIONS

Yang, Title: Suppression of Row Hammer Effect by Doping Profile Modification in Saddle-Fin Array Devices for sub-30-nm DRAM Technology; IEEE Electron Device Letters, 2016.

* cited by examiner

# US 10,062,613 B1

SEMICONDUCTOR DEVICE AND METHOD FOR FABRICATING THE SAME

BACKGROUND OF THE INVENTION

1. Field of the Invention

The invention relates to a method for fabricating semiconductor device, and more particularly to a method for fabricating a dynamic random access memory (DRAM) device.

2. Description of the Prior Art

As electronic products develop toward the direction of miniaturization, the design of dynamic random access memory (DRAM) units also moves toward the direction of higher integration and higher density. Since the nature of a DRAM unit with buried gate structures has the advantage of possessing longer carrier channel length within a semiconductor substrate thereby reducing capacitor leakage, it has been gradually used to replace conventional DRAM unit with planar gate structures.

Typically, a DRAM unit with buried gate structure includes a transistor device and a charge storage element to receive electrical signals from bit lines and word lines. Nevertheless, current DRAM units with buried gate structures still pose numerous problems due to limited fabrication capability. Hence, how to effectively improve the performance and reliability of current DRAM device has become an important task in this field.

SUMMARY OF THE INVENTION

According to an embodiment of the present invention, a method for fabricating semiconductor device includes the steps of: forming a first trench and a second trench in a substrate; forming a first work function metal layer in the first trench and the second trench; forming a patterned mask to cover the second trench; removing the first work function metal layer from the first trench; forming a second work function metal layer in the first trench and the second trench; and forming a conductive layer in the first trench and the second trench to form a first gate structure and a second gate structure.

According to another aspect of the present invention, a semiconductor device includes: a first gate structure in a substrate; and a second gate structure in the substrate and adjacent to the first gate structure. Preferably, a number of work function metal layers in the first gate structure and the second gate structure are different.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
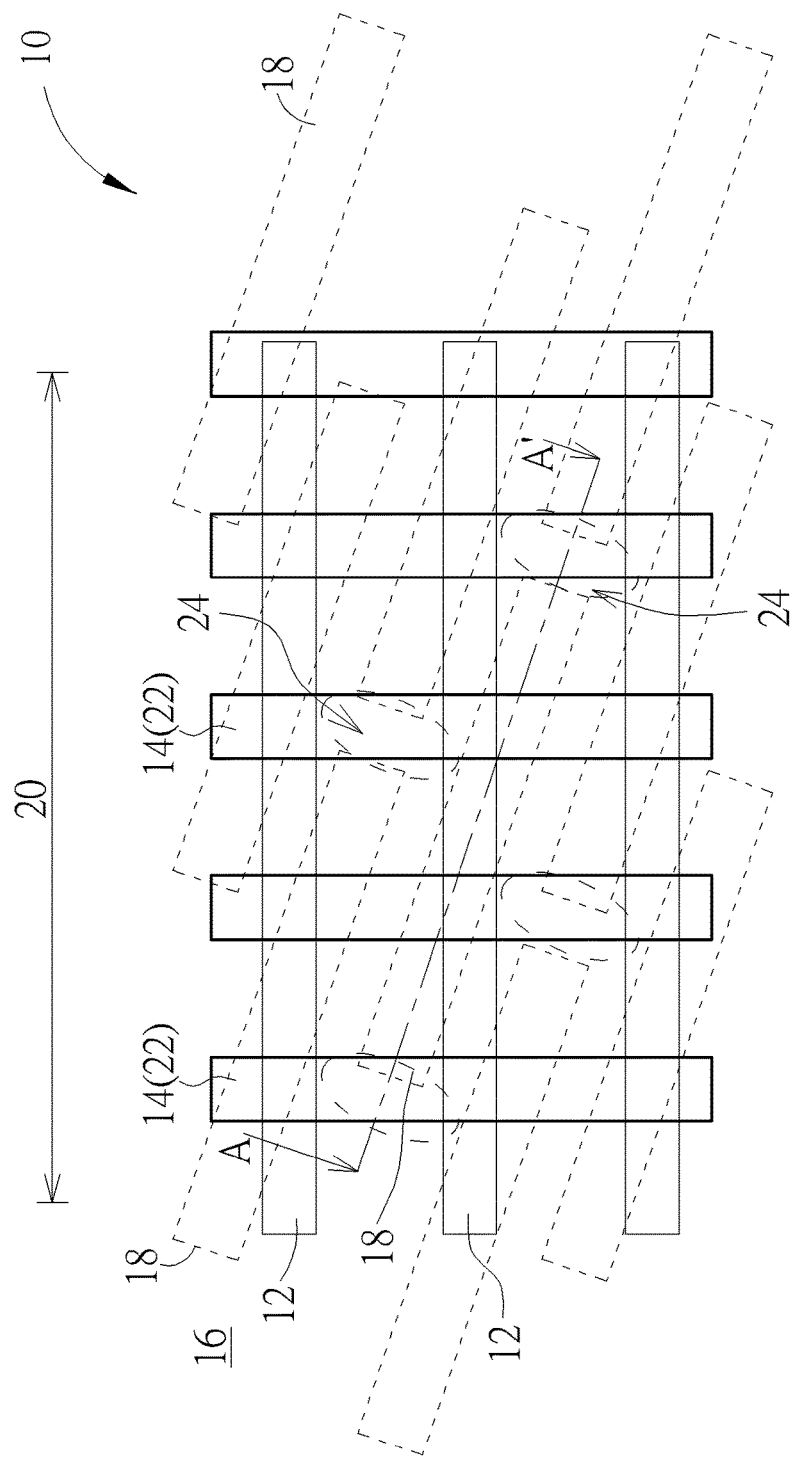
FIGS. 1-9 illustrate a method for fabricating a DRAM device according to an embodiment of the present invention.

Referring to FIGS. 1-9, FIGS. 1-9 illustrate a method for fabricating a DRAM device according to an embodiment of the present invention, in which FIG. 1 illustrates a top-view diagram and FIGS. 2-9 are cross-sectional views illustrating steps of fabricating the DRAM device of FIG. 1 along the sectional line AA'. Preferably, the present embodiment pertains to fabricate a memory device, and more particularly a DRAM device 10, in which the DRAM device 10 includes at least a transistor device (not shown) and at least a capacitor structure (not shown) that will be serving as a smallest constituent unit within the DRAM array and also used to receive electrical signals from bit lines 12 and word lines 14.

As shown in FIG. 1, the DRAM device 10 includes a substrate 16 such as a semiconductor substrate or wafer made of silicon, a shallow trench isolation (STI) 24 formed in the substrate 16, and a plurality of active areas (AA) 18 defined on the substrate 16. A memory region 20 and a periphery region (not shown) are also defined on the substrate 16, in which multiple word lines 14 and multiple bit lines 12 are preferably formed on the memory region 20 while other active devices (not shown) could be formed on the periphery region. For simplicity purpose, only devices or elements on the memory region 20 are shown in FIG. 1 while elements on the periphery region are omitted.

In this embodiment, the active regions 18 are disposed parallel to each other and extending along a first direction, the word lines 14 or multiple gates 22 are disposed within the substrate 16 and passing through the active regions 18 and STIs 24. Preferably, the gates 22 are disposed extending along a second direction, in which the second direction crosses the first direction at an angle less than 90 degrees.

The bit lines 12 on the other hand are disposed on the substrate 16 parallel to each other and extending along a third direction while crossing the active regions 18 and STI 24, in which the third direction is different from the first direction and orthogonal to the second direction. In other words, the first direction, second direction, and third direction are all different from each other while the first direction is not orthogonal to both the second direction and the third direction. Preferably, contact plugs such as bit line contacts (BLC) (not shown) are formed in the active regions 18 adjacent to two sides of the word lines 14 to electrically connect to source/drain region (not shown) of each transistor element and storage node contacts (not shown) are formed to electrically connect to a capacitor.

Figure 2:
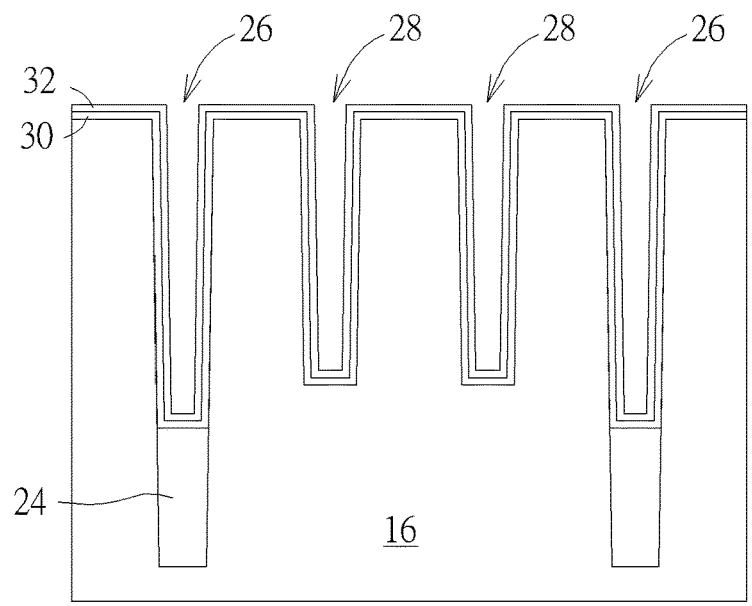

The fabrication of word lines 14 (or also referred to as buried word lines) is explained below. As shown in FIG. 2, first trenches 26 and second trenches 28 are formed in the substrate 16 and shallow trench isolations (STIs) 24 are disposed on the bottom of the first trenches 26, in which the top surface of the STIs 24 is slightly lower than the bottom surface of the second trenches 28. Next, an in-situ steam generation (ISSG) process is conducted to form a gate dielectric layer 30 in the first trenches 26 and second trenches 28, and a first work function metal layer 32 is formed on the gate dielectric layer 30.

In this embodiment, the gate dielectric layer 30 preferably includes silicon oxide or high-k dielectric layer depending on the demand of the product, in which the high-k dielectric layer is preferably selected from dielectric materials having dielectric constant (k value) larger than 4. For instance, the high-k dielectric layer may be selected from hafnium oxide ($HfO_2$), hafnium silicon oxide ($HfSiO_4$), hafnium silicon oxynitride (HfSiON), aluminum oxide ($Al_2O_3$), lanthanum oxide ($La_2O_3$), tantalum oxide ($Ta_2O_5$), yttrium oxide ($Y_2O_3$), zirconium oxide ($ZrO_2$), strontium titanate oxide ($SrTiO_3$), zirconium silicon oxide ($ZrSiO_4$), hafnium zirconium oxide ($HfZrO_4$), strontium bismuth tantalate (SrBi$_2$Ta$_2$O$_9$, SBT), lead zirconate titanate (PbZr$_x$Ti$_{1-x}$O$_3$, PZT), barium strontium titanate (Ba$_x$Sr$_{1-x}$TiO$_3$, BST) or a combination thereof.

Figure 3:
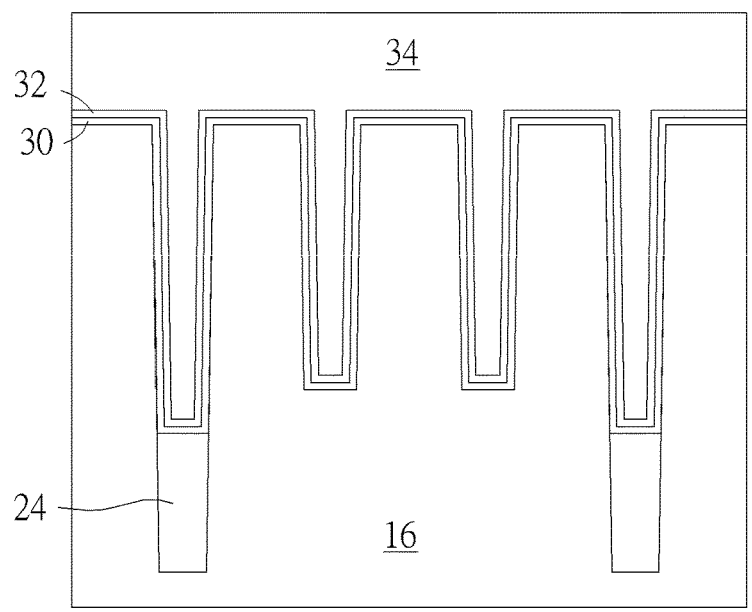

Next, as shown in FIG. 3, a mask layer 34 is formed to fill the first trenches 26 and the second trenches 28, in which the mask layer 34 preferably includes organic material such as but not limited to for example spin-on-glass (SOG), bottom anti-reflective coating (BARC), or resist material.

Figure 4:
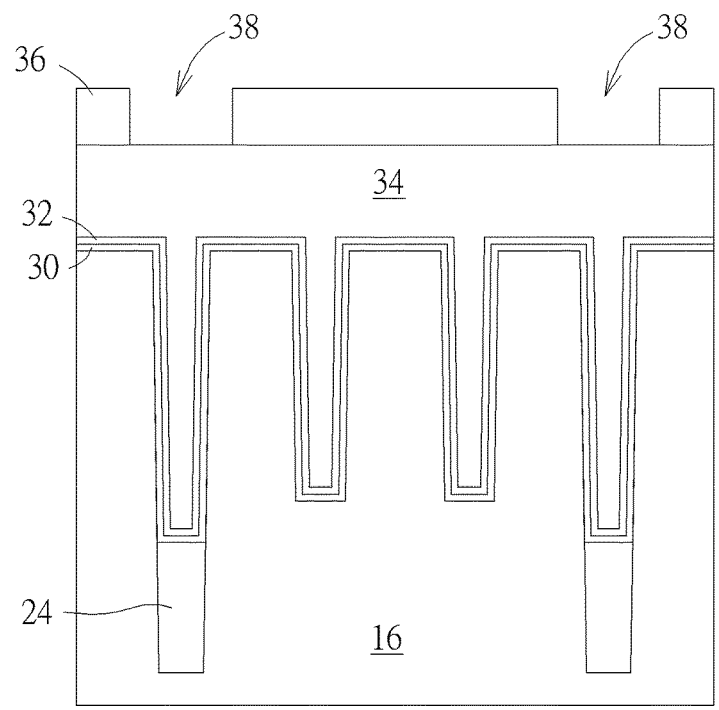

Next, as shown in FIG. 4, a patterned resist 36 is formed on the mask layer 34, in which the patterned resist 36 includes openings 38 exposing part of the mask layer 34 directly on top of the first trenches 26. It should be noted that the openings 38 in this embodiment only exposes part of the STI 24 instead of the entire STI 24, such as the STI 24 between the active regions 18 labeled by the circles shown in FIG. 1.

Figure 5:
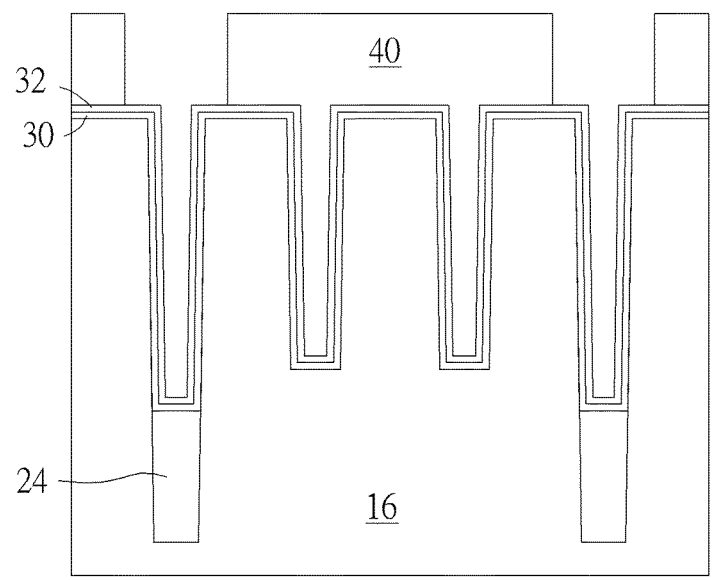

Next, as shown in FIG. 5, an etching process is conducted by using the patterned resist 36 as mask to remove part of the mask layer 34 in the first trenches 26. This forms a patterned mask 40 with openings to expose part of the first work function metal layer 32. In this embodiment, the approach of removing part of the mask layer 34 to form the patterned mask 40 could be accomplished by various means depending on the material of the mask layer 34 being used. For instance, if the patterned mask 40 were to be made of spin-on-glass, it would be desirable to use a gas including but not limited to for example CF$_4$ and/or hydrogen gas to remove part of the mask layer 34. If the patterned mask 40 were made of BARC, it would be desirable to use a gas including but not limited to for example nitrogen gas and/or hydrogen gas to remove part of the mask layer 34, which are all within the scope of the present invention.

Figure 6:
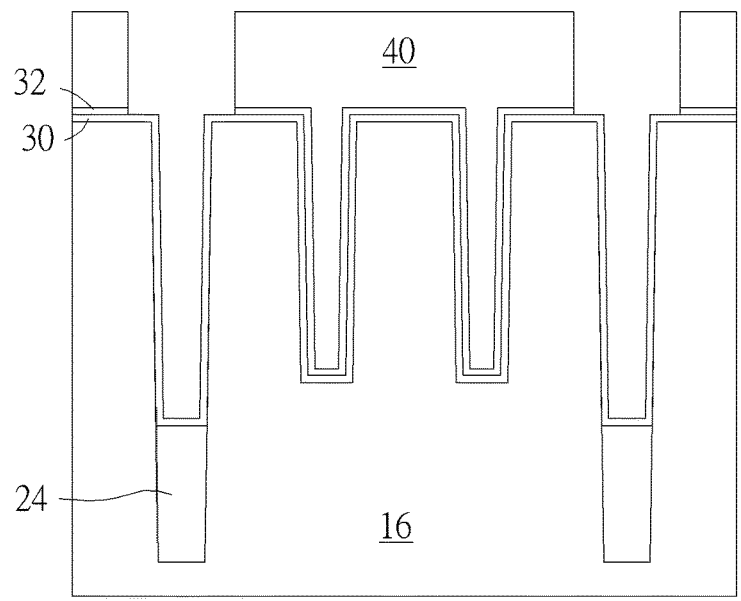

Next, as shown in FIG. 6, another etching process is conducted by using the patterned mask 40 as mask to remove part of the first work function metal layer 32 in the first trenches 26 and expose the gate dielectric layer 30 underneath. In this stage, it would be desirable to use standard cleaning agent such as SC1 and/or SC2 to remove part of the first work function metal layer 32 whether the patterned mask 40 is made of SOG or BARC.

Figure 7:
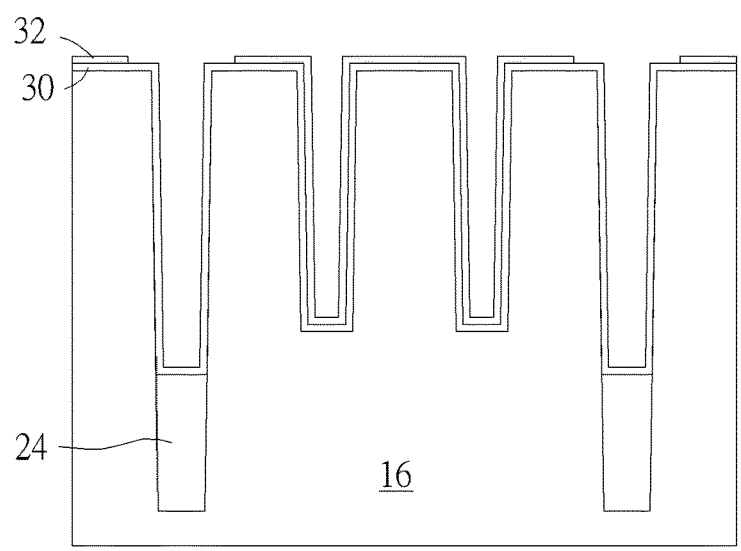

Next, as shown in FIG. 7, the patterned mask 40 is stripped completely. In this embodiment, if the patterned mask 40 were made of SOG, it would be desirable to hydroxide (OH$^-$) to remove the patterned mask 40, and if the patterned mask 40 were made of BARC, it would be desirable to use nitrogen gas or hydrogen gas to remove the patterned mask 40 completely, which are all within the scope of the present invention.

Figure 8:
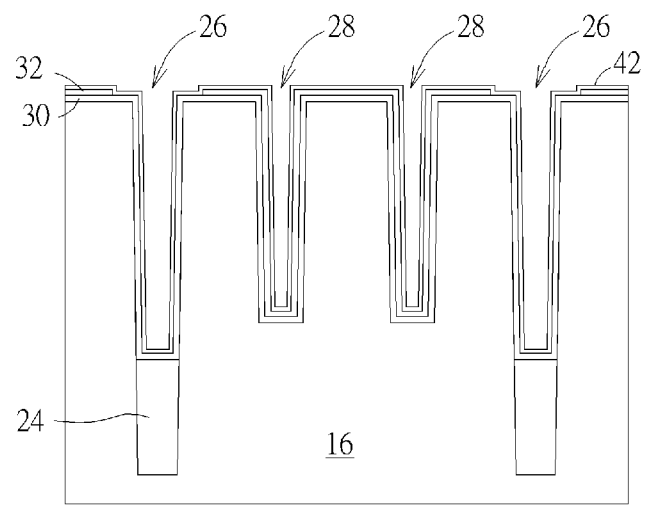

Next, as shown in FIG. 8, a second work function metal layer 42 is formed in the first trenches 26 and second trenches 28, in which the second work function metal layer 42 deposited into the first trenches 26 is disposed on the sidewalls of the first trenches 26 as well as on the STI 24 and the second work function metal layer 42 deposited into the second trenches 28 is disposed on the first work function metal layer 32. In this embodiment, the first work function metal layer 32 and the second work function metal layer 42 are preferably work function metal layers adapted for different conductive type devices. For instance, the first work function metal layer 32 in this embodiment preferably includes a p-type work function metal layer while the second work function metal layer 42 includes a n-type work function metal layer, but not limited thereto. According to an embodiment of the present invention, the first work function metal layer 32 could also include n-type work function metal layer while the second work function metal layer 42 could include p-type work function metal layer, which are all within the scope of the present invention.

In this embodiment, n-type work function metal layer could include work function metal layer having a work function ranging between 3.9 eV and 4.3 eV such as but not limited to for example titanium aluminide (TiAl), zirconium aluminide (ZrAl), tungsten aluminide (WAl), tantalum aluminide (TaAl), hafnium aluminide (HfAl), or titanium aluminum carbide (TiAlC), but it is not limited thereto. P-type work function metal layer on the other hand could include work function metal layer having a work function ranging between 4.8 eV and 5.2 eV such as but not limited to for example titanium nitride (TiN), tantalum nitride (TaN), or tantalum carbide (TaC), but not limited thereto.

Figure 9:
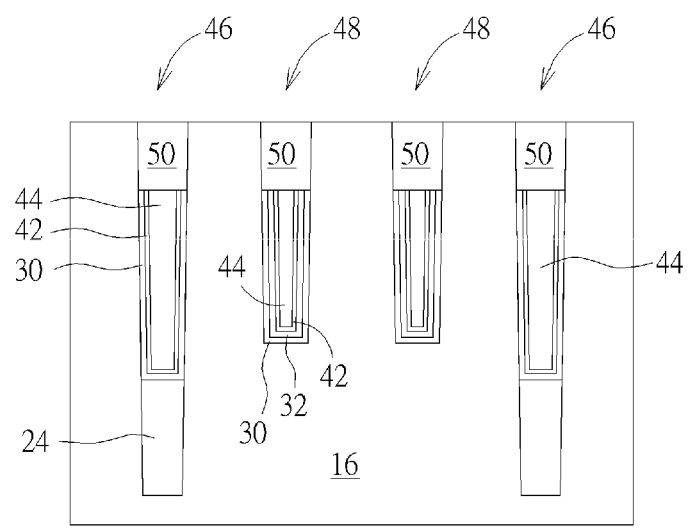

Next, as shown in FIG. 9, a conductive layer 44 is formed on the second work function metal layer 42 in the first trenches 26 and second trenches 28, and an etching back process is conducted to remove part of the conductive layer 44, part of the second work function metal layer 42, and part of the first work function metal layer 32 so that the top surfaces of the remaining conductive layer 44, second work function metal layer 42, and first work function metal layer 32 are slightly lower than the top surface of the substrate 16. This forms first gate structures 46 in the first trenches 26 and second gate structures 48 in the second trenches 28, in which each of the first gate structures 46 and second gate structures 48 constitute the word lines 12 illustrated in FIG. 1. Next, a hard mask 50 is formed on each of the first gate structure 46 and second gate structure 48 so that the top surfaces of the hard masks 50 and the substrate 16 are coplanar. In this embodiment, the conductive layer 44 preferably includes low resistance material such as but not limited to for example Cu, Al, W, TiAl, CoWP, or combination thereof.

Next, an ion implantation process could be conducted depending on the demand of the process to form a doped region (not shown) such as lightly doped drain or source/drain region in the substrate 16 adjacent to two sides of the first gate structure 46 or second gate structure 48. Next, a contact plug process could be conducted to form word line contacts adjacent to two sides of the second gate structures 48 electrically connecting the source/drain region and bit lines formed thereafter and storage node contacts electrically connecting the source/drain region and capacitors fabricated in the later process.

Referring again to FIG. 9, FIG. 9 illustrates a structural view of a DRAM device according to an embodiment of the present invention. As shown in FIG. 9, the DRAM device preferably includes at least a STI 24 disposed in the substrate 16, at least a first gate structures 46 disposed on the STI 24, and a second gate structure 48 disposed in the substrate 16 adjacent to the first gate structure 46. Preferably, the number or quantity of the work function metal layers in the first gate structure 46 is different from the number or quantity of the work function metal layers in the second gate structure 48.

Specifically, the first gate structure 46 preferably includes one single layer of work function metal layer such as the second work function metal layer 42 and the second gate structure 48 includes two layers of work function metal layers such as the first work function metal layer 32 and the second work function metal layer 42.

Moreover, the top surface of the STI 24 is slightly lower than the bottom surface of the second gate structure 48, the top surface of the first gate structure 46 is even with the top surface of the second gate structure 48, and the top surface of the hard masks 50 atop the first gate structure 46 and second gate structure 48 is even with the top surface of the substrate 16.

Figure 10:
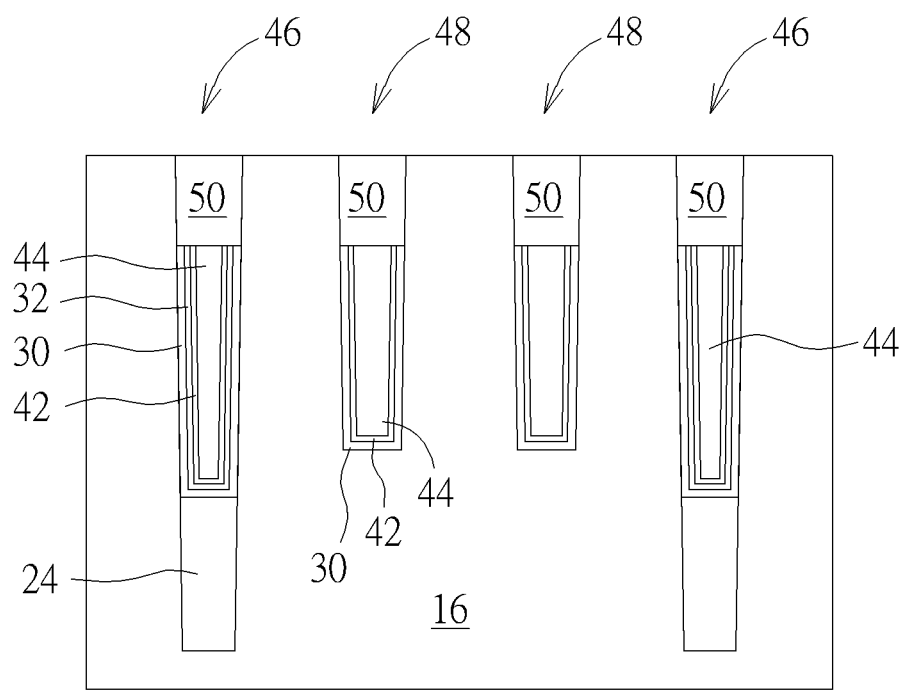
FIG. 10 illustrates a structural view of a DRAM device according to an embodiment of the present invention.

Referring to FIG. 10, FIG. 10 illustrates a structural view of a DRAM device according to an embodiment of the present invention. As shown in FIG. 10, the DRAM device includes at least a STI 24 disposed in the substrate 16, a first gate structure 46 disposed on the STI 24, and a second gate structure 48 disposed in the substrate 16 adjacent to the first gate structure 46. Preferably, the number or quantity of the work function metal layers in the first gate structure 46 is different from the number or quantity of the work function metal layers in the second gate structure 48.

In contrast to the aforementioned embodiment of first removing the first work function metal layer 32 from the first trenches 26 and then forming the second work function metal layer 42 into the first trenches 26 and the second trenches 28 as disclosed in FIGS. 1-9, it would be desirable to reverse the order of the aforementioned approach by first removing the first work function metal layer 32 from the second trenches 28 and then forming the second work function metal layer 42 into the first trenches 26 and second trenches 28. By using this approach as shown in FIG. 10, the number of work function metal layers in the first gate structures 46 would be greater than the number of work function metal layers in the second gate structures 48. For instance, the first gate structure 46 disposed on top of the STI 24 preferably includes two layers work function metal layers including the first work function metal layer 32 and the second work function metal layer 42 while the second gate structure 48 only includes a single layer of work function metal layer such as the second work function metal layer 42.

Typically during the fabrication of the DRAM device, current leakage or cross-link between gate structures (such as the first gate structures disclosed in the aforementioned embodiment) disposed on the STI and the adjacent gate structures (such as the second gate structures disclosed in the aforementioned embodiment) has been commonly observed to result in so-called row hammer effect, which not only allows adjacent columns in a DRAM chip to induce bit inversion but also enables any other user to alter the storage content within the machine. To resolve this issue, the present invention first removes the work function metal layer from either the first trench or second trench in the substrate and then forms another work function metal layer in both first trench and second trench at the same time. By doing so the resulting first gate structure and second gate structure formed thereafter would have different number or quantity of work function metal layers and row hammer effect caused by electronic interference between adjacent gate lines could be reduced effectively.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for fabricating semiconductor device, comprising:
   providing a substrate;
   removing part of the substrate to form a first trench and a second trench in the substrate;
   forming a first work function metal layer in the first trench and the second trench;
   forming a patterned mask to cover the second trench;
   removing the first work function metal layer from the first trench;
   forming a second work function metal layer in the first trench and the second trench; and
   forming a conductive layer in the first trench and the second trench to form a first gate structure and a second gate structure.

2. The method of claim 1, further comprising:
   forming a gate dielectric layer in the first trench and the second trench; and
   forming the first work function metal layer on the gate dielectric layer.

3. The method of claim 1, wherein the patterned mask comprises an organic layer.

4. The method of claim 1, further comprising:
   removing the patterned mask after removing the first work function metal layer; and
   forming the second work function metal layer in the first trench and the second trench.

5. The method of claim 1, wherein the top surfaces of the first gate structure and the second gate structure are coplanar.

6. The method of claim 1, further comprising forming a shallow trench isolation (STI) in the first trench before forming the first work function metal layer.

7. The method of claim 6, wherein a top surface of the STI is lower than a bottom surface of the second trench.

8. The method of claim 1, further comprising forming a hard mask on each of the first gate structure and the second gate structure after forming the conductive layer.

9. The method of claim 8, wherein the top surfaces of the hard mask and the substrate are coplanar.

10. The method of claim 8, wherein the hard mask comprises silicon nitride.

* * * * *